United States Patent
Mühlemann

[11] Patent Number: 5,463,239
[45] Date of Patent: Oct. 31, 1995

[54] INTEGRATED SEMICONDUCTOR CIRCUIT PROTECTED AGAINST HIGH VOLTAGE BREAKDOWN

[75] Inventor: Kurt Mühlemann, Zürich, Switzerland

[73] Assignee: U.S. Philips Corporation, New York, N.Y.

[21] Appl. No.: 254,456

[22] Filed: Jun. 6, 1994

Related U.S. Application Data

[63] Continuation of Ser. No. 31,420, Mar. 15, 1993, abandoned.

[30] Foreign Application Priority Data

Mar. 16, 1992 [EP] European Pat. Off. ............ 92200740

[51] Int. Cl.[6] .................................................. H03K 17/04
[52] U.S. Cl. .......................... 257/355; 327/427; 327/434
[58] Field of Search ................................. 257/355, 360, 257/356, 328, 337, 357, 358; 307/296.5, 304, 303.1, 303.2, 315, 571, 572, 577, 583, 584

[56] References Cited

U.S. PATENT DOCUMENTS

| | | | |
|---|---|---|---|
| 4,789,917 | 12/1988 | Miller | 257/356 |
| 4,967,103 | 10/1990 | Dikken et al. | 307/548 |
| 5,144,518 | 9/1992 | Miyazari | 257/355 |

OTHER PUBLICATIONS

Sze, S. M., "Semiconductor Devices, Physics and Technology", AT&T Bell Laboratories, N.J., 1985, pp. 347–348.
IEEE Custom Integrated Circuits Conference, Portland, Oreg., May 4–7, 1987 pp. 267–271.

Primary Examiner—Robert P. Limanek
Assistant Examiner—David B. Hardy
Attorney, Agent, or Firm—Steven R. Biren

[57] ABSTRACT

A circuit integrated on a semiconductor substrate in order to drive a load, (for example, a VFD) by means of a comparatively high voltage (for example, 35 V), includes a first and a second supply voltage terminal for application of the comparatively high voltage, an input, and a load output for connection of a load to be driven by the circuit. A switching transistor, a protection transistor and a sub-circuit are a part of the integrated circuit. The switching transistor and the protection transistor are connected in series with the gate of the switching transistor connected to the input. The source of the switching transistor is connected to a first supply voltage terminal, and the drain of the protection transistor supplies a signal for the sub-circuit during operation. The output of the sub-circuit is connected to the load output and the gate of the protection transistor receives a fixed voltage. The protection transistor is constructed so that it limits the voltage at the drain of the switching transistor.

24 Claims, 3 Drawing Sheets

INTEGRATED SEMICONDUCTOR CIRCUIT PROTECTED AGAINST HIGH VOLTAGE BREAKDOWN

This is a continuation of application Ser. No. 08/031,420, filed Mar. 15, 1993, now abandoned.

BACKGROUND OF THE INVENTION

This invention relates to a circuit which is integrated on a semiconductor substrate for level conversion or for driving a load, (for example, Vacuum Fluorescence Displays, with a comparatively high voltage (for example, 35 V), comprising a first and a second supply voltage terminal for application of the comparatively high voltage, an input and an output, a switching transistor, a protection transistor and a sub-circuit, the switching transistor and the protection transistor being connected in series, the gate of the switching transistor being connected to the input, the source of the switching transistor being connected to a first supply voltage terminal, and the drain of the protection transistor supplying a signal for the sub-circuit during operation, an output of the sub-circuit being connected to the output and the gate of the protection transistor receiving a fixed voltage.

A circuit of this kind is known from Proceedings of the IEEE Custom Integrated Circuits Conference, Portland, Oregon, May 4–7, 1987, pp. 267–271. In circuits of this kind it is important to ensure that no breakdowns occur in any location due to excessive field strengths, especially at the drain or gate junctions. A comparatively high voltage is a voltage at which the drain junction of the switching transistor would break down.

SUMMARY OF THE INVENTION

It is an object of the invention to provide a circuit integrated on a semiconductor substrate in which the vulnerability of the circuit to the comparatively high voltage for driving the load connected to the circuit is substantially reduced or even eliminated, without additional technology and without complex process steps being used.

To achieve this, an integrated circuit on a semiconductor substrate in accordance with the invention is characterized in that the protection transistor is constructed so that it limits the voltage at the drain of the switching transistor.

An embodiment of the integrated circuit in accordance with the invention is characterized in that the gate of the protection transistor is provided on the field oxide layer of the integrated circuit. Because the gate of the protection transistor is provided on the field-oxide layer of the integrated circuit in accordance with the invention, the threshold voltage of such a transistor is much higher (for example, 26 V) than in conventional transistors. This is due to the thickness of the field oxide. The so-called "body effect" also makes a contribution in this respect. The threshold voltage $V_{TX}$ of a MOSFET can be expressed as:

$$V_{TX} = V_{TO} - \gamma [\sqrt{V_{BS} + 2\phi_F} - \sqrt{2\phi_F}]$$

for p-channel MOS transistors (for n-channel transistors, $-V_{BS}$ and $\gamma$ should be inserted in this equation), where:

$V_{TO}$: threshold voltage for $V_{BS}=0$ $V_{BS}$: bulk-source voltage $\phi_F$: Fermi potential: $(kT/q).\ln(N/N_i)$ and $$\gamma = \frac{\sqrt{2\epsilon_s q N_D}}{C_{ox}}$$

Therein, $\epsilon_s$: dielectric constant of silicon $N_D$: density of the charge carriers in bulk (donators for p-channel MOS transistors, acceptors for n-channel MOS transistors)

N: surface concentration in channel region $N_i$: intrinsic concentration of the charge carriers in the purified material sample q: elementary charge and $C_{ox}$: $\epsilon_{ox}/t_{ox}$ where $\epsilon_{ox}$: dielectric constant of the oxide layer $t_{ox}$: thickness of the oxide layer.

Conventional MOS transistors have a comparatively thin oxide layer ($\approx$ 30–50 nm) between the gate and the channel region. Because the gate of the protection transistor is provided on the thick field oxide (thickness 0.8–1 μm) already present in any integrated circuit, a comparatively high threshold voltage is obtained. For $V_{TO}$ a parasitic threshold voltage (dielectric in the form of field oxide instead of gate oxide) of from approximately 12 to 15 V is concerned. Added thereto is a strong body effect, because $\gamma$ is inversely proportional to $C_{ox}$ which is small because of $t_{ox}$. This high threshold voltage prevents the occurrence of a breakdown at the drain diode of the switching transistor during operation because the potential at the drain of the switching transistor remains limited. The protection transistor is turned off already before the drain potential of the switching transistor has dropped so far that a breakdown of the cited diode occurs.

A further embodiment of the integrated circuit in accordance with the invention is characterized in that the switching transistor comprises an extended drain and/or the protection transistor comprises an extended drain and an extended source. An extended drain or source region is formed when the well material is used to envelop the p$^+$ in a p-channel transistor in p-well technology or the n$^+$ in an n-channel transistor in n-well technology. The breakdown strength of the drain or source region is thus increased.

A further embodiment of the integrated circuit in accordance with the invention is characterized in that the sub-circuit comprises a resistance. The switching transistor, the protection transistor and the resistance together form a level converter having an output terminal connected to the drain of the protection transistor.

A further embodiment of the integrated circuit in accordance with the invention is characterized in that the sub-circuit comprises a current-amplifier circuit which is conceived as an emitter-follower circuit comprising two vertical integrated bipolar transistors forming a Darlington pair. The sub-circuit serves for impedance conversion. In the case of an n-substrate, a Darlington pair is appropriate in this respect because the logic high state must be low-ohmic for VFD drivers.

A further embodiment of the integrated circuit in accordance with the invention is characterized in that the sub-circuit comprises a further switching transistor whose source is connected to the second supply voltage terminal, whose gate is connected to the drain of the protection transistor, and whose drain is connected to the first one of a series-connected cascode of further protection transistors. The drain of the last further protection transistor of the cascode is connected to the output, the gates of the cascode of further protection transistors being connected via a series connection of resistances. The output is connected to the emitter of a switch-off transistor whose collector is connected to the first supply voltage terminal and whose base is connected, via a resistance, to its emitter and to the drain of a further transistor whose source is connected to the first supply voltage terminal and whose gate is connected to the drain of the protection transistor. The cascode of resistances is proportioned so that the voltages at the drain-gate junctions and at the drain-source junctions of the further switching transistor and the further protection transistors are limited. In VFD drivers, the logic high state should be low-ohmic. In the case of a p-substrate, a Darlington pair cannot be used for this purpose because the dual switching element is a pnp substrate transistor which can make only the logic low state low-ohmic. Therefore, in accordance with the invention the cascode of the further switching transistor and the further protection transistors is used to make the high state low-ohmic. The gate voltage of the protection transistors is comparatively low in the switched-on state. In the switched-off state the voltages are separated so that each transistor has to cope with only a part of the overall load.

A further embodiment of the integrated circuit in accordance with the invention is characterized in that the gate of the protection transistor is connected to the second supply voltage terminal. This embodiment is advantageous because no further fixed voltage of a value between the voltage levels of the two supply voltage terminals need be provided for the gate of the protection transistor.

BRIEF DESCRIPTION OF THE DRAWING

The invention will be described in detail hereinafter with reference to embodiments shown in the accompanying drawing; in which.

DESCRIPTION OF THE PREFERRED EMBODIMENTS

Figure 1A:
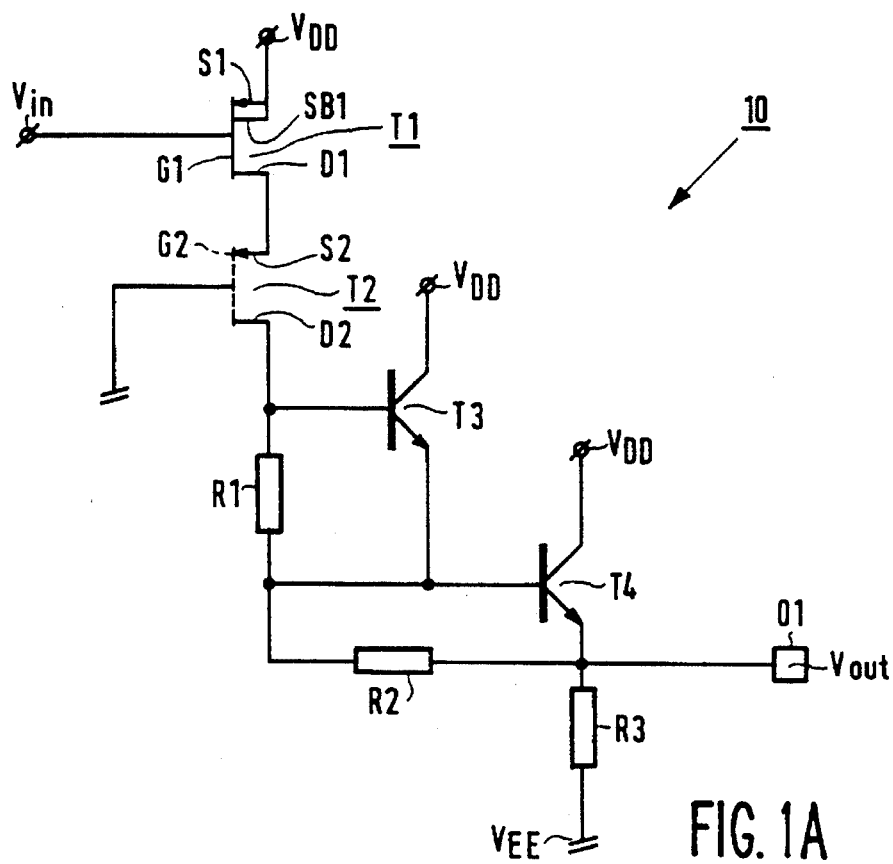
FIGS. 1A, 1B, 1C and 1D show a preferred embodiment of a circuit in accordance with the invention.
Figure 1B:
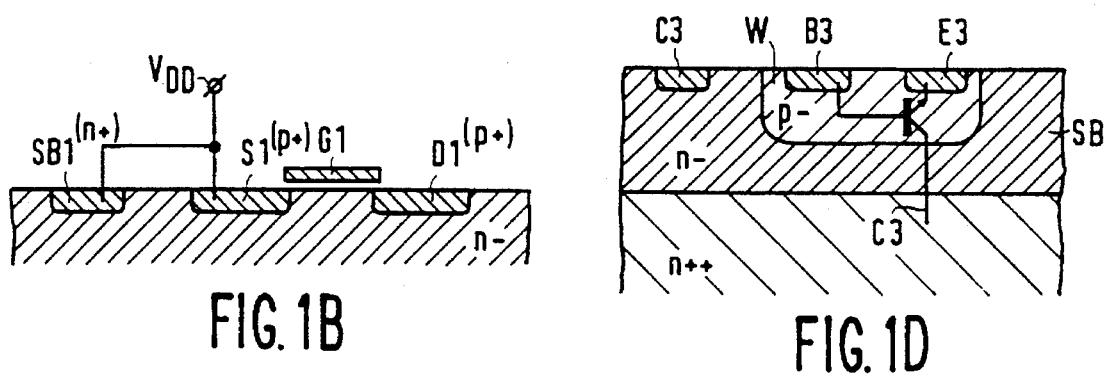

FIG. 1A shows a preferred embodiment of a circuit in accordance with the invention. The circuit is used, for example, for driving vacuum fluorescence displays. A supply voltage of 5 V and −30 V is then applied to the supply voltage terminals VDD and VEE, respectively. The circuit comprises a first PMOS switching transistor T1, a second PMOS, protection transistor T2, a sub-circuit comprising two bipolar npn transistors T3 and T4 which form a Darlington output stage, and three resistors R1, R2 and R3. The PMOS transistor T1 is a conventional transistor having a drain D1 and a source S1 which are constructed as $p^+$ regions D1, S1 (see Fig. 1B) in a substrate of n-material, the gate oxide having a thickness of from 30 to 50 nm. The gate G1 receives an input signal Vin. The input signal Vin has, for example, two logic levels: VDD (=5 V) and $V_{SS}$ (=0 V).

The protection transistor T2 (see FIG. 1C) has a $p^-$ drain D2$p^-$ and a $p^-$ source S2$p^-$ which are connected via $p^+$ regions. The polysilicon gate G2 is arranged on the field oxide FO1. Consequently, as has already been explained, the transistor T2 has a threshold value (for example, $V_{T2}$=−26 V for $V_{BS}$≈2.5 V; $V_{T2}$≈−35 V for $V_{BS}$ =5 V) substantially higher than that of the switching transistor T1 ($V_{T1}$ ≈1 V). The drain D2$p^-$ and the source S2$p^-$ are connected to A1 contacts 100 and 101 provided in the insulating silicon oxide layer SO1.

Figure 1D:
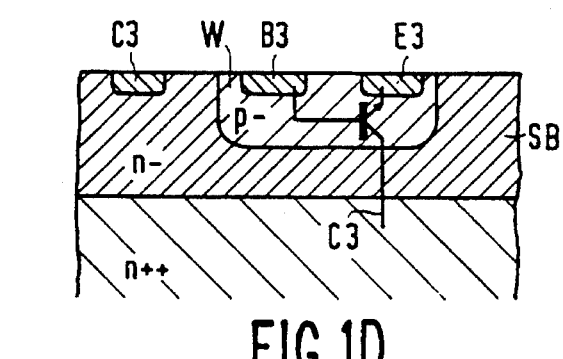
Figure 1C:
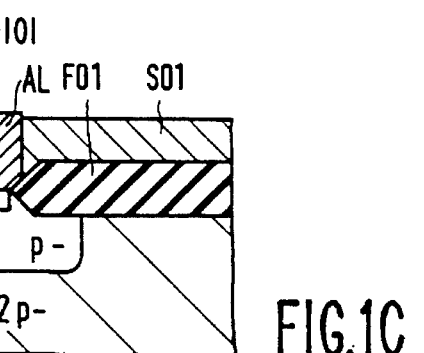

The bipolar transistors T3 and T4 are constructed as vertical integrated transistors as appears from FIG. 1D. In the substrate SB of $n^-$ material, provided on the $n^{++}$ semiconductor substrate material as an epitaxial layer, there is formed a $p^-$ tub W. In said tub W there are formed a $p^+$ region as the base B3 and an $n^+$ region as the emitter E3 of the bipolar transistors T3 or T4. An n+ region in the substrate SB is the collector C3 of the bipolar transistors T3 and T4 and is connected to the supply voltage VDD. The use of $n^{++}$ substrate material renders the circuit less sensitive to latch-up problems. Moreover, the collector supply lead resistance is reduced, which is particularly advantageous for a Darlington output stage. The resistances R1 (10 kΩ), R2 (10 kΩ) and R3 (100 kΩ) can be formed as a respective $p^-$ tub in the $n^-$ layer. The resistance R3 need not be integrated. It can be connected outside of the integrated circuit between the load output O1 and the supply voltage VEE.

The circuit in accordance with the invention as shown in FIG. 1 operates as follows. When an input voltage $V_{SS}$ (=0 V) is applied to the input terminal Vin, the transistor T1 is turned on. The transistor T2 is also turned on because the gate G2 is maintained at the fixed voltage VEE (=−30 V), so that the base of the transistor T3 becomes substantially equal to $V_{DD}$. The output voltage Vout is raised via the Darlington pair T3 and T4 (Vout≈VDD−2.$V_{BE}$; $V_{BE}$=base-emitter voltage of the transistors T3 and T4). The Darlington pair T3, T4 ensures suitable drive power at the load output O1.

When the input voltage Vin is changed from 0 V to $V_{DD}$, the transistor T1 is turned off. As a result, the transistor T2 can no longer supply current. Consequently, the base of the transistor T3 drops to $V_{EE}$. The voltage at the source S2 of the protection transistor T2 also drops towards $V_{EE}$. When the voltage difference between the gate and the source of the second transistor T2 drops below the threshold voltage $V_{TX}$ (=−26 V), the protection transistor T2 is turned off. Consequently, the potential at S2 remains limited to voltages in the vicinity of $V_{DD}$. The transistor T2 is turned off before its source drops below $V_{SS}$ because (as stated) the threshold voltage $V_{T2}$=−35 V for $V_{BS}$=5V. The transistor T1 is thus protected against drain and gate/drain breakdowns.

Figure 2A:
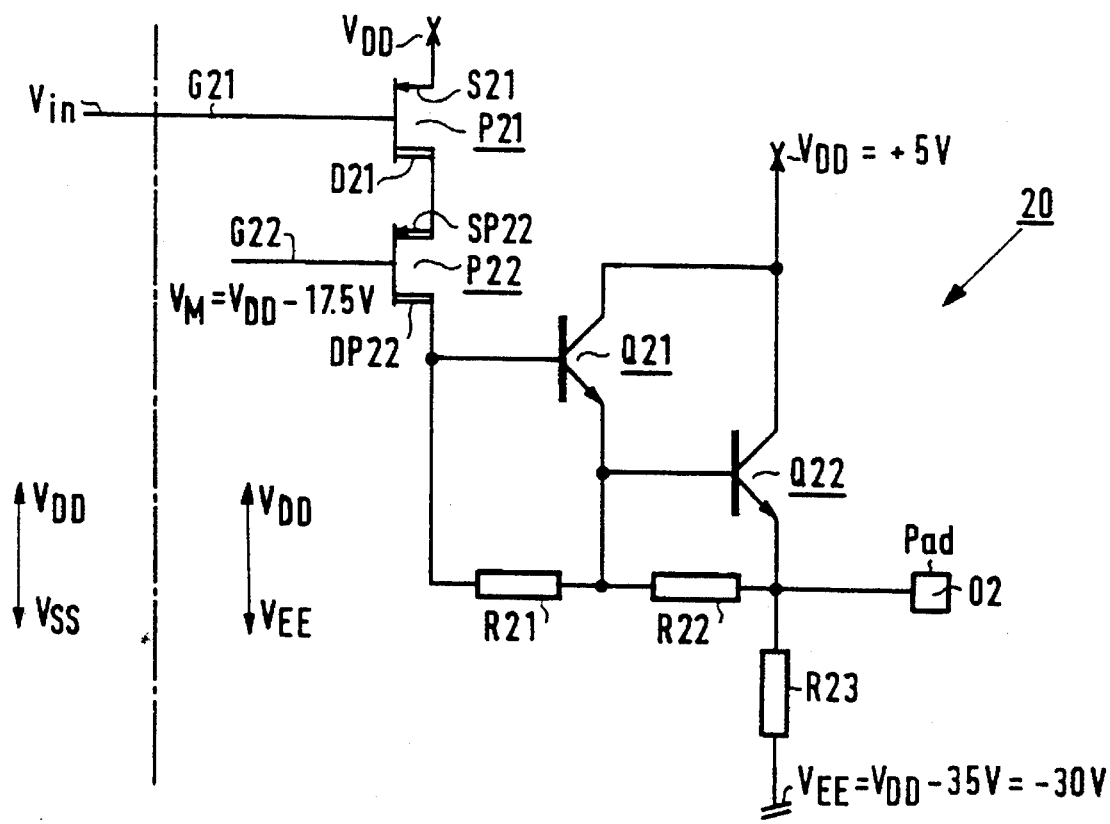
FIGS. 2A and 2B show an embodiment of a further circuit in accordance with the invention.

FIG. 2A shows a further embodiment of a circuit in accordance with the invention in which the sub-circuit (comprising transistors Q21, Q22 and resistances R21, R22 and R23) can be identical to the corresponding sub-circuit (comprising transistors T3, T4 and resistances R1, R2 and R3) of FIG. 1A and can also have the same function: impedance conversion for a load to be connected to the load output O2 (FIG. 2A), for example a vacuum fluorescence display. The transistors Q21 and Q22 are vertical npn transistors and the resistances R21, R22 and R23 may be P-well resistances. It is not absolutely necessary to integrate also the resistance R23. It can also be connected outside of the integrated circuit between the load output O2 and the supply voltage $V_{EE}$.

Two transistors, i.e. a switching transistor P21 and a protection transistor P22, are connected in series between the supply voltage $V_{DD}$ and the sub-circuit comprising the transistors Q21, Q22 and the resistances R21, R22 and R23.

Figure 2B:
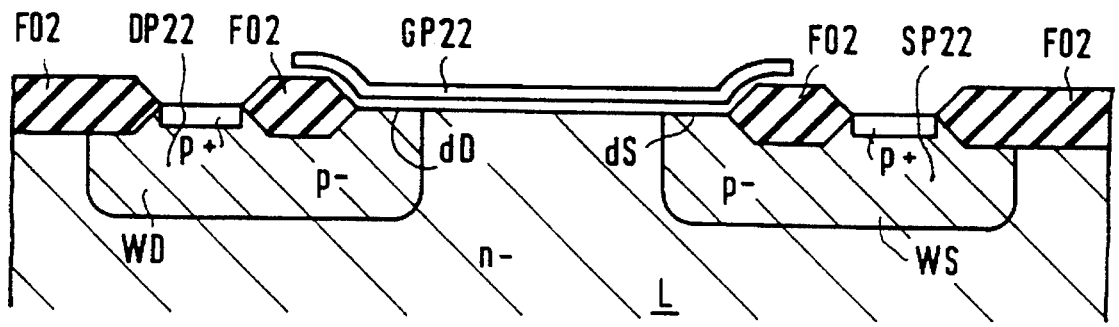

The control voltage $V_{in}$ varies between $V_{DD}$ and $V_{SS}$. It is applied to the gate G21 of the transistor P21. The PMOS transistor P21 is a conventional MOS transistor, except for the construction of its drain. The drain DP21 is an "extended" drain which is thus capable of withstanding higher voltage without a breakdown occurring at the drain. An extended drain or source region is formed by using the tub material to envelop the $p^+$ in a p-channel transistor in p-tub technology or the $n^+$ in an n-channel transistor in n-tub technology. Thus, a higher breakdown strength of the drain or source region is obtained in the "extended" version relative to the substrate material. The protection transistor P22 comprises a gate G22 which is connected to a fixed voltage $V_M$; for example, $V_M=(V_{DD}+V_{EE})/2$ in the example of FIG. 2. The extended drain and the extended source are special aspects of this transistor. FIG. 2B is a diagrammatic cross-sectional view of the transistor P22 (not to scale). In the substrate L of $n^-$ semiconductor material there are provided two tubs WD and WS of $p^-$ semiconductor material, which tubs constitute the drain and the source of the transistor P22. The source and drain connections consist of $p^+$ material. They are surrounded by the thick field oxide FO2. The gate GP22, being insulated from the n' substrate L by a gate oxide layer, extends between the source and the drain and may overlap the thick field oxide layer FO2. The paths dD and dS between the field oxide FO2 and the $n^-$ material are sufficiently large to make misalignment between gate and drain/source regions acceptable.

The operation of the circuit shown in FIG. 2A is as follows: when a potential $V_{SS}$ (=0 V) is applied to the gate G21 of the transistor P21, the transistor P21 is turned on and hence also the transistor P22, because the source potential approaches $V_{DD}$ (=+5 V). The voltage between the gate G22 and the source S22 amounts to approximately $-17.5$ V. The current flowing through the transistors P21 and P22 will turn on the Darlington transistor pair Q21 and Q22, thus driving a load connected to the load output O2.

As soon as the voltage $V_{in}$ at the gate G21 increases and reaches $V_{DD}-|V_{TH}|$, the transistor P21 is turned off. The voltage at the drain D21 then decreases until the gate-source voltage of the transistor P22 decreases to $V_{TH}$ (the source voltage is then slightly lower than the fixed voltage $V_M+1V_{TH}$). The drain voltage for the transistor P21 is thus limited to the range from $\geq V_{DD}-17.5+|V_{TH}|=-11.5$ V which can be withstood by an extended drain construction. The drain-gate voltage for the transistor P22 also remains below $-20$ V ($V_{EE}-V_M\approx-17.5$ V). The operation of the transistor P22, therefore, is not endangered by a drain-gate breakdown.

Figure 3:
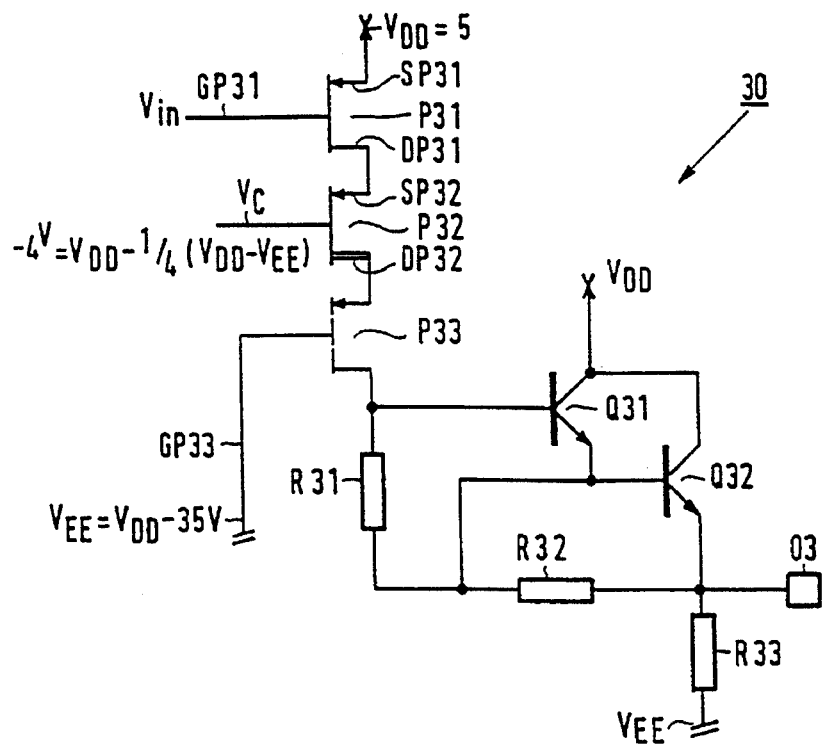
FIG. 3 shows a further embodiment of a circuit in accordance with the invention.

FIG. 3 shows a further embodiment of a circuit 30 in accordance with the invention. The circuit 30 comprises a switching transistor P31 and two protection transistors P32 and P33. These transistors are connected to one another and to a subcircuit (consisting of transistors Q31, Q32 as well as resistors R31, R32 and R33), in series between the supply voltage $V_{DD}$ (+5 V) and the load output O3. The circuit 30 can be integrated on a semiconductor substrate, the load output O3 being connected to an output terminal of the integrated circuit, for example, in order to drive a vacuum-fluorescence display.

The components Q31, Q32, R31 and R32 of the sub-circuit are identical or similar to the components T3, T4, R1 and R2 and have the same function. It is not absolutely necessary to integrate also the resistor R33. It can be connected outside of the integrated circuit between the load output O3 and the supply voltage $V_{EE}$. The transistor P31 is a conventional MOSFET having a gate oxide layer of normal thickness (30–50 nm). Except for the extended drain (see FIG. 2B), the transistor P32 is also a conventional transistor, as is the transistor P31. The transistor P33 is a parasitic transistor whose gate GP33 is provided on the (thick) field oxide (see FIG. 1C). The gate GP33 of the transistor P33 carries a fixed potential $V_{EE}$ ($\approx-30$ V). The gate GP32 of the transistor P32 carries a fixed potential $V_C$ ($V_C=V_{DD}-\frac{1}{4}(V_{DD}-V_{EE})\approx-4$ V). The gate GP31 of the switching transistor P31 receives the control voltage $V_{in}$ ($0 \leq V_{in} \leq 5$ V). When the control voltage equals 0 V, the transistors P31, P32 and P33 are turned on and apply current to the transistors Q31 and Q32. A load connected to the load output O3 is thus driven.

When the control voltage $V_{in}$ increases to 5 V, the transistor P31 is turned off. The voltage at the drain DP31 decreases to $V_C+|1 V_{TH}|$, so to $\approx-3$ V. The potential difference between the drain DP31 and the gate GP31 or the substrate amounts to approximately 8 V; this is far less than would be required for a breakdown.

The voltage at the drain DP32 itself decreases until the transistor P33 is turned off. This occurs when $V_{EE}+|V_{TP}|$ is reached, where $V_{TP}$ is the parasitic threshold voltage. The voltage difference between the extended drain DP32 and the gate GP32 should not exceed 15 V. In other words, for a gate voltage of $V_C\approx-4$ V, the voltage at the drain DP32 may not drop below $-19$ V. The threshold voltage $|V_{TP}|$ of the transistor P33 should amount to $\geq 11$ V; this is generally the case.

Figure 4:
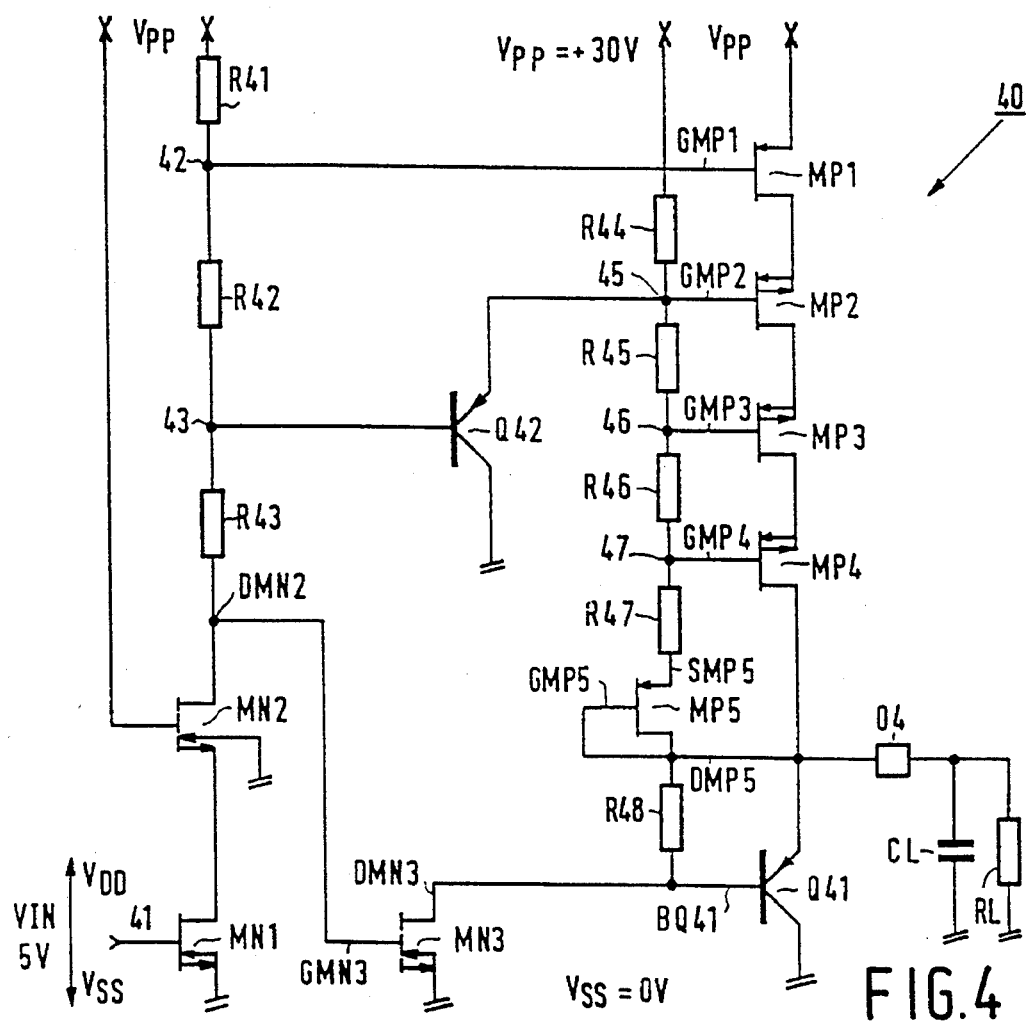
FIG. 4 shows an embodiment of a circuit in accordance with the invention which can be integrated on a p-substrate.

FIG. 4 shows a further embodiment of a circuit 40 in accordance with the invention which can be integrated on a p-substrate. This circuit 40 comprises an NMOS switching transistor MN1, an NMOS protection transistor MN2, and a sub-circuit which is connected in series between two supply voltages $V_{PP}$ ($\approx+30$ V) and $V_{SS}$ (=0 V). The sub-circuit comprises resistances R41, R42, R43, bipolar pnp transistors Q41 and Q42, a (parasitic) NMOS transistor MN3, further resistances R44, R45, R46, R47 and R48, and PMOS transistors MP1, MP2, MP3, MP4 and MP5. FIG. 4 also shows the load to be powered by the circuit 40. The load includes a capacitance CL with parallel-connected resistance RL connected to the load output O4.

The resistances R41 to R43 are connected to one another and in series with the transistors MN1 and MN2 between $V_{PP}$ and $V_{SS}$. The transistors MP1, MP2, MP3, MP4 and Q41 are connected in series between $V_{PP}$ and $V_{SS}$, the collector of the transistor Q41 being connected to $V_{SS}$ and its emitter to the drain of the transistor MP4. The sources of MP4, MP3, MP2 and MP1 are connected to a respective drain of the transistors MP3, MP2, MP1 and to $V_{PP}$. The gate GMP1 of the transistor MP1 is connected to the junction of the resistances R41 and R42. The gate GMP2 of the transistor MP2 is connected to the junction point of the resistances R44 and R45 whereto the emitter of the transistor Q42 is also connected. The collector of the transistor Q42 is connected to $V_{SS}$, its base being connected to the junction point of the resistances R42 and R43. The gates GMP3 and GMP4 of the transistors MP3 and MP4 are connected to the junction points of the resistances R45 and R46 and of R46 and R47, respectively. The source SMP5 of the transistor MP5 is connected to the resistance R47. The gate GMP5 and the drain DMP5 are connected to one another, to the emitter of the transistor Q41 and to the output terminal O4. Furthermore, the drain DMP5 is connected to the base BQ41 via the resistance R48. The drain DMN2 is connected to the gate GMN3 of the transistor MN3 whose source is connected to $V_{SS}$ and whose drain DMN3 is connected to the base BQ41 of the transistor Q41.

In FIG. 4 a plurality of level converters are used to realize a 35 V VFD driver stage on a p substrate. The first level converter consists of transistors MN1/MN2 plus resistances. The circuit still requires the inverted high voltage. This could be generated by inversion of the logic signal by means of the subsequent second level converter. However, it is simpler to achieve the inversion at the high voltage side by directly driving the "protection transistor". The inverter and the switching transistor can then be dispensed with. This results in the structure consisting of transistor MN3 with the resistances R44–R48. Finally, transistor MP1 may be considered to be a switching transistor in the context of the invention. The associated protection structure is the cascode circuit of transistors MP2–MP4. Instead of transistor Q41, use could be made of a resistance (however, because of the faster switch-off, the active load Q41 offers advantages for practical applications of the VDF driver).

Transistor Q41 could be driven by a separate level converter (of the same polarity as MN3/resistances). That, however, would increase the complexity. Therefore, dual use is made of the level converter MN3/resistances. The use of the same level converter for two purposes (driving transistor Q41 and bias for the cascode transistors MP2–MP4) gives rise to a conflict at output O4 on $V_{PP}$. Transistor MP5, connected as a diode, serves for recoupling.

Finally, the two level converters MN1/MN2/resistances and MN3/resistances are coupled via Q42. Transistor Q42 may be considered to be a "sub-circuit" (connected this time as an emitter follower instead of a Darlington stage). When point 43 is used instead of the drain DMN2, a suitable intermediate voltage is used instead of the full swing VSS/VPP.

The circuit 40 operates as follows: when a control voltage $V_{in}$–5 V ($V_{SS}$=0 V) is applied to the input 41, the switching transistor MN1 is turned on and hence also the protection transistor MN2. The transistor MN2 (and the transistor MN3) is similar to the transistor shown in FIG. 1C and deviates therefrom in that use is made of p⁻ semiconductor material instead of n⁻ semiconductor material, etc. The voltage at the gate GMN3 decreases to approximately $V_{SS}$, so that the transistor MN3 is turned off. The voltage at the junction point 42 decreases to approximately $3V_{PP}/4$, governed by the resistance ratio:

$$\frac{R42 + R43}{R41 + R42 + R43}$$

The voltage at the junction point 43 decreases to approximately $V_{pp}$–10 V, again governed by a resistance ratio:

$$\frac{R43}{R41 + R42 + R43}.$$

The bipolar transistor Q42 is turned on and the voltage at the junction point 45 will amount to $V_{pp}$–10 V+$|V_{BE}|$, $V_{BE}$ being the base-emitter voltage of transistor Q42. The transistors MP1 and MP2 are then turned on, like the transistors MP3 and MP4 whose gates GMP3 and GMP4 carry the same potential as the gate GMP2 because the transistor MN3 is turned off, as described above. Because the transistors MP1–MP4 are turned on, the output O4 is connected to a voltage of approximately $V_{PP}$, depending on the load. It is important to ensure that no voltage differences of more than 10 V occur across the gates or across the drains and sources of transistors MP1, MP2, MP3 and MP4. Therefore, no breakdowns are to be expected in this condition. The transistor Q41 is also turned off, because the emitter and the base BQ41 carry the same voltage. No current flows into the resistance chain R45, R46 and R47 from the output O4 because the transistor MP5, which is connected as a diode, is polarized in the reverse direction. A load (in this case represented by a resistance RL and a capacitance CL) may be connected to the output O4. This load may be, for example, a vacuum fluorescence display element which is powered via the transistors MP1–MP4.

When the control voltage at the input 41 is reset to 0 V, the transistor MN1 is turned off and the voltage at the gate GMN3 increases to $V_{pp}$. The transistor MN3 is turned on and a current will flow through the voltage divider R44–R48 and the "diode" MP5. The gate GMP1 of the transistor MP1 is connected to $V_{pp}$, so that the transistor MP1 is turned off. The transistor Q42 is turned off because the voltage at the emitter, being connected to the point 45, is lower than the base voltage amounting to $V_{pp}$. The voltage divider R44–R48 is proportioned so that a voltage of <10 V remains between the source and the drain of each of the transistors MP1, MP2, MP3 and MP4. As a result, in each transistor voltage stress is avoided. Breakdowns of sources and drains, in bulk, do not occur because each transistor is situated in its own n⁻ tub which is electrically connected to the relevant source.

The base of the transistor Q41 carries approximately $V_{SS}$=0 V. The current through the resistance R48 produces a voltage increase between the base and emitter of the transistor Q41, which is thus turned on and pulls the output O4 to approximately $V_{SS}$+$|V_{BE}|$.

The invention is not restricted to the described embodiments. Further embodiments are readily feasible within the scope of the invention. For example, the parasitic transistors could be constructed so as to have polysilicon gates or aluminium gates.

I claim:

1. A circuit having at least a part thereof adapted to be integrated on a semiconductor substrate, said circuit comprising: a first and a second supply voltage terminal, an input and an output, a switching transistor having a gate, a drain and a source, a protection transistor having a gate and a drain, and a sub-circuit, wherein the switching transistor and the protection transistor are connected in a series circuit between the first and second supply voltage terminals such that said terminals apply a high voltage across said series circuit, the gate of the switching transistor being connected to the input, the source of the switching transistor being connected to the first supply voltage terminal, and the drain of the protection transistor supplying a signal to the sub-circuit, and means for connecting an output of the sub-circuit to the output of the circuit, wherein the gate of the protection transistor receives a fixed voltage, wherein at least one of the protection transistor and the switching transistor is constructed so that the switching transistor drain voltage is limited to a value below its threshold breakdown voltage, and wherein the gate of the protection transistor is connected to the second supply voltage terminal so as to receive said fixed voltage.

2. The circuit as claimed in claim 1, wherein the gate of the protection transistor is provided on a field oxide layer of the integrated circuit.

3. The circuit as claimed in claim 1, wherein the switching transistor includes an extended drain.

4. The circuit as claimed in claim 3 wherein the drain and the source of the protection transistor are formed by p⁻ wells in n⁻ material, and with p⁺ regions for contacting being formed in the p⁻ wells.

5. The circuit as claimed in claim 1, wherein the protection transistor includes an extended drain and at least one of an extended and normal source.

6. The circuit as claimed in claim 1;
wherein said connecting means connects said output of the circuit to the first supply voltage terminal via a series circuit including said switching transistor and said protection transistor.

7. A circuit adapted to be integrated on a semiconductor substrate, said circuit comprising: a first and a second supply voltage terminal, an input and an output, a switching transistor having a gate, a drain and a source, a protection transistor having a gate and a drain and a sub-circuit with the switching transistor and the protection transistor connected in series to the first and second supply voltage terminals, the gate of the switching transistor being connected to the input, the source of the switching transistor being connected to the first supply voltage terminal, and the drain of the protection transistor supplying a signal to the sub-circuit, means connecting an output of the sub-circuit to the output of the circuit, and wherein the gate of the protection transistor receives a fixed voltage, characterized in that at least one of the protection transistor and the switching transistor is constructed so that the switching transistor drain voltage is limited to a value below its threshold breakdown voltage, and a third transistor having a gate, means connecting the third transistor in series between the switching transistor and the protection transistor and with the gate of the third transistor connected to a fixed voltage of a value between the gate voltage of the protection transistor and the first supply voltage.

8. The circuit as claimed in claim 7, wherein the switching transistor, the protection transistor and the third transistor are p-channel MOS transistors, a p⁺ drain terminal of the third transistor being situated in a p⁻ well which extends as far as a p-channel underneath the gate.

9. A circuit adapted to be integrated on a semiconductor substrate, said circuit comprising: a first and a second supply voltage terminal, an input and an output, a switching transistor having a gate, a drain and a source, a protection transistor having a gate and a drain and a sub-circuit with the switching transistor and the protection transistor connected in series to the first and second supply voltage terminals, the gate of the switching transistor being connected to the input, the source of the switching transistor being connected to the first supply voltage terminal, and the drain of the protection transistor supplying a signal to the sub-circuit, means connecting an output of the sub-circuit to the output of the circuit, and wherein the gate of the protection transistor receives a fixed voltage, characterized in that at least one of the protection transistor and the switching transistor is constructed so that the switching transistor drain voltage is limited to a value below its threshold breakdown voltage, and wherein the sub-circuit comprises a current amplifier circuit.

10. The circuit as claimed in claim 9, wherein the current amplifier circuit includes an emitter-follower circuit.

11. The circuit as claimed in claim 10, wherein the emitter-follower circuit comprises two vertical integrated bipolar transistors forming a Darlington pair.

12. The circuit as claimed in claim 11, wherein the drain of the protection transistor is connected to the second supply voltage terminal via a series connection of at least first and second resistances, a base of a first bipolar transistor being connected to a junction of the series connection and the drain of the protection transistor, and means connecting an emitter of the bipolar transistor to a junction of the first and second resistance of the series connection and to the output of the integrated circuit.

13. The circuit as claimed in claim 12, wherein a base of a second bipolar transistor is connected to the emitter of the first bipolar transistor, and the emitter of the second bipolar transistor is connected to a junction of the second resistance and a third resistance and constitutes the output of the circuit.

14. The circuit as claimed in claim 12, wherein the first bipolar transistor is formed in a respective p⁻ well in n⁻ semiconductor material, the base being formed by a p⁺ region and the emitter being formed by a n⁺ region in the p⁻ well, the collector of a first bipolar transistor being made of the n⁻ material.

15. The circuit as claimed in claim 12, wherein the first and second resistances are formed as a p⁻ well in n⁻semiconductor material.

16. A circuit having at least a part thereof adapted to be integrated on a semiconductor substrate, said circuit comprising: a first and a second supply voltage terminal, an input and an output, a switching transistor having a gate, a drain and a source, a protection transistor having a gate and a drain, and a sub-circuit, wherein the switching transistor and the protection transistor are connected in a series circuit between the first and second supply voltage terminals such that said terminals apply a high voltage across said series circuit, the gate of the switching transistor being connected to the input, the source of the switching transistor being connected to the first supply voltage terminal, and the drain of the protection transistor supplying a signal to the sub-circuit, and means for connecting an output of the sub-circuit to the output of the circuit, wherein the gate of the protection transistor receives a fixed voltage, wherein at least one of the protection transistor and the switching transistor is constructed so that the switching transistor drain voltage is limited to a value below its threshold breakdown voltage, and wherein the sub-circuit comprises a further switching transistor whose source is connected to the second supply voltage terminal, whose gate is connected to the drain of the protection transistor, and whose drain is connected to a first one of a series-connected cascode of further protection transistors, a drain of a last further protection transistor of the cascode being connected to the output, gates of the cascode of further protection transistors being connected via a series connection of resistances, the output being connected to the emitter of a switch-off transistor whose collector is connected to the first supply voltage terminal and whose base is connected, via a resistance, to its emitter and to a drain of a further transistor whose source is connected to the first supply voltage terminal and whose gate is connected to the drain of the protection transistor, the series connection of resistances being proportioned as to resistance so that voltages at drain-gate junctions and at drain-source junctions of the further switching transistor and the further protection transistors are limited.

17. A circuit adapted to be integrated on a semiconductor substrate, comprising; a first and a second supply voltage terminal, an input, an output for connection to a load to be driven by the circuit, a transistor and a sub-circuit being connected in series between one of the two supply voltage terminals and the output, the transistor having a gate for receiving a control signal, wherein an electrode of the transistor connected to the sub-circuit is one of a p+ and an n+ region, formed in one of a p– well and an n– well, respectively, which well is provided in one of an n– and p– material, respectively, and extends as far as underneath a relevant gate, a further transistor connected in series between the sub-circuit and the transistor, a gate of the further transistor receiving a fixed voltage of a value which is between the voltages at the supply voltage terminals; and wherein a drain and a source of the further transistor are one of p and n regions which are formed by one of p– and n– wells, respectively, provided in one of n– and in p⁻ material and which extend as far as underneath the gate of the further transistor.

18. A semiconductor circuit with protection against high voltage breakdown comprising:

a first and a second supply voltage terminal, an input terminal and an output terminal, a switching transistor having a gate electrode and a drain electrode, a protection transistor having a gate electrode and a drain electrode, a sub-circuit including a resistance, first means connecting the switching transistor, the protection transistor and the sub-circuit in series circuit between said first supply voltage terminal and said output terminal and with the drain of the protection transistor connected to the output terminal via the sub-circuit, second means connecting the gate electrode of the switching transistor to said input terminal, third means connecting the gate electrode of the protection transistor to a source of reference voltage, fourth means connecting the second supply voltage terminal to the drain electrode of the protection transistor via the sub-circuit, and wherein at least one of said transistors is constructed so as to limit a voltage at the drain electrode of the switching transistor to a value below its breakdown voltage.

19. The semiconductor circuit as claimed in claim 18 wherein the sub-circuit further comprises at least one bipolar transistor that receives a signal from the drain electrode of the protection transistor, and a second resistance coupling the drain electrode of the protection transistor to said output terminal.

20. The semiconductor circuit as claimed in claim 18 wherein the switching transistor and the protection transistor are constructed so that their gate electrodes are provided respectively on a gate oxide layer and a field oxide layer of the semiconductor substrate, and wherein the field oxide layer is significantly thicker than the gate oxide layer.

21. The semiconductor circuit as claimed in claim 18 wherein at least one of the switching transistor and the protection transistor are constructed so as to have an extended drain and the fourth connecting means connects the switching transistor, the protection transistor and a part of the sub-circuit including said resistance in a second series circuit between the first and second supply voltage terminals.

22. The semiconductor circuit as claimed in claim 18 wherein the sub-circuit further comprises;

a series connection of second and third resistances which connect the drain electrode of the protection transistor to the second supply voltage terminal, and a bipolar transistor having its base connected to the drain of the protection transistor and its emitter connected to a node between the second and third resistances.

23. The semiconductor circuit as claimed in claim 18 wherein the gate electrode of the protection transistor is on a field oxide layer of the semiconductor substrate which is significantly thicker than an oxide layer which supports the gate electrode of the switching transistor.

24. The circuit as claimed in claim 18 wherein the third connecting means connects the gate electrode of the protection transistor to the source of reference voltage so as to supply a reference voltage to said gate electrode that is independent of an input signal at said input terminal.

* * * * *